(12) United States Patent
Filippo et al.

(10) Patent No.: US 7,522,397 B2
(45) Date of Patent: Apr. 21, 2009

(54) INPUT/OUTPUT INTERFACE WITH CURRENT SENSING

(75) Inventors: Roberto Filippo, Beinasco TO (IT); Fabrizio Cortigiani, Padua (IT); Franco Mignoli, Verona (IT); Silvia Solda, Padua (IT)

(73) Assignee: Infineon Technologies AG, Munich (DE)

(*) Notice: Subject to any disclaimer, the term of this patent is extended or adjusted under 35 U.S.C. 154(b) by 212 days.

(21) Appl. No.: 11/506,157

(22) Filed: Aug. 16, 2006

(65) Prior Publication Data
US 2007/0040578 A1 Feb. 22, 2007

(30) Foreign Application Priority Data
Aug. 16, 2005 (EP) .................................. 05017780

(51) Int. Cl.
*H02H 5/04* (2006.01)
(52) U.S. Cl. .................. 361/93.8; 327/378; 702/173
(58) Field of Classification Search .................. 323/282, 323/284, 351, 312; 307/350, 253, 362, 608, 307/592, 358; 327/378, 438, 512, 513, 138, 327/262; 361/18, 25, 37, 54, 106, 93.8; 702/173, 702/187, 55, 86
See application file for complete search history.

(56) References Cited

U.S. PATENT DOCUMENTS

| 3,538,424 A | 11/1970 | Frederiksen |
| 4,654,545 A * | 3/1987 | Giordano ..................... 327/80 |
| 2005/0088216 A1 | 4/2005 | Arndt et al. |

* cited by examiner

*Primary Examiner*—Rajnikant B Patel
(74) *Attorney, Agent, or Firm*—Maginot Moore & Beck

(57) ABSTRACT

An interface circuit includes an input terminal, a controlled current sink, a current measurement arrangement, and a logic circuit. The input terminal is configured to receive an input signal. The controlled current sink is operably coupled to the input terminal, and is operable to controllably take up a current from the input terminal according to a transmission signal. The current measurement arrangement is configured to generate a current measurement signal based on the current taken up by the current sink. The logic circuit is operably coupled to receive the current measurement signal and the input signal, and is configured to generate a signal depending on the input signal.

18 Claims, 3 Drawing Sheets

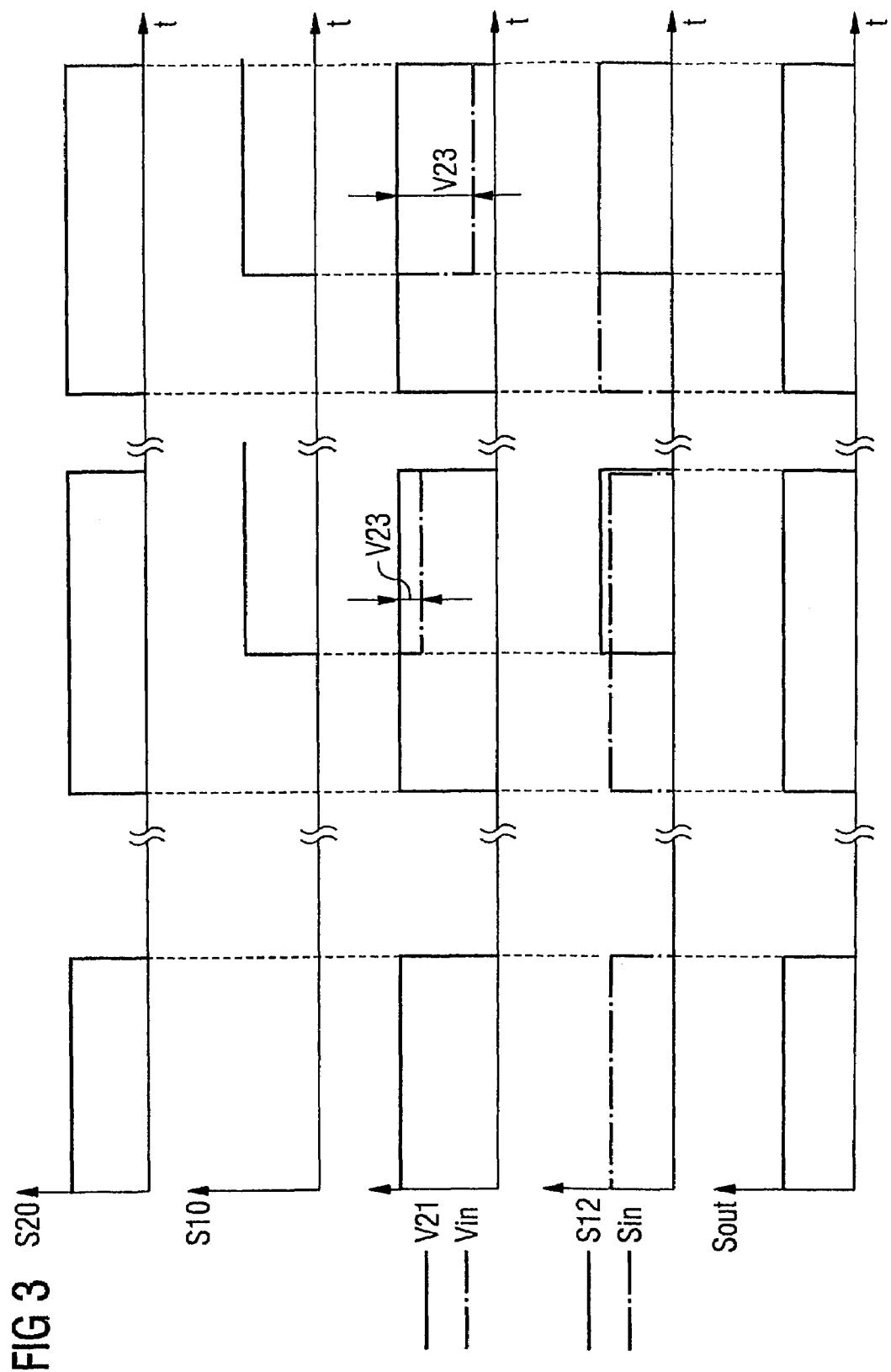

INPUT/OUTPUT INTERFACE WITH CURRENT SENSING

FIELD OF THE INVENTION

The present invention relates to an interface circuit with an input terminal for applying an input signal and with a current sink connected to the input terminal, which takes up a current from the input terminal depending on a transmission signal.

BACKGROUND

Interface circuits are known that are able both to receive an input signal via the input terminal and to produce an output signal via the input terminal by controlling the current uptake of the current sink.

Such an interface circuit is described, for example, in the data sheet VNB35NV04/VNP35NV04/VNV35NV04/VNW35NV04 "OMNIFET II", ST Microelectronics, March 2004, page 5/19. The interface circuit described in this publication is part of an actuator circuit of a MOSFET, which receives an actuation signal for the MOSFET via an input terminal. If the MOSFET has an excess temperature, the interface circuit draws an elevated current via the input terminal. This elevated current uptake at the input terminal is detected by an external diagnostic circuit connected to the input terminal as a sign of the presence of an excess temperature.

The elevated current uptake stresses the signal source which furnishes the input signal. If the signal source has a high output resistance, the elevated current uptake of the interface circuit may result in the signal source no longer being able to maintain the input signal level. Thus, the signal level drops, which is misinterpreted in the interface circuit as being a change in the signal level of the input signal.

SUMMARY OF THE INVENTION

The object of the present invention is to provide an interface circuit having an input terminal for furnishing an input signal and a controllable current sink coupled to the input terminal, wherein the interface circuit is able to reliably detect the input signal level even when the current sink takes up a current across the input terminal.

This object is achieved by an interface circuit according to embodiments of the invention.

A first embodiment is an interface circuit that includes an input terminal, a controlled current sink, a current measurement arrangement, and a logic circuit. The input terminal is configured to receive an input signal. The controlled current sink is operably coupled to the input terminal, and is operable to controllably take up a current from the input terminal according to a transmission signal. The current measurement arrangement is configured to generate a current measurement signal based on the current taken up by the current sink. The logic circuit is operably coupled to receive the current measurement signal and the input signal, and is configured to generate a signal depending on the input signal.

The interface circuit according to exemplary embodiments of the invention will be explained in greater detail with reference to the drawings.

BRIEF DESCRIPTION OF THE DRAWINGS

FIG. 3 shows, as an example, time curves of selected signals occurring in the interface circuit according to the invention according to FIGS. 1 and 2 for various operating situations.

DETAILED DESCRIPTION

In the figures, unless otherwise specified, the same reference symbols refer to the same circuit components and signals with the same meaning.

The interface circuit according an exemplary embodiment of the invention comprise an input terminal for supplying an input signal, a controlled current sink, which is connected to the input terminal and which receives a current from the input terminal dependent on a transmission signal. The interface circuit furthermore comprises a current measurement arrangement, which determines a current received from the current sink and furnishes a current measurement signal depending on this determined current, as well as a logic circuit, which receives the current measurement signal and the input signal and furnishes a signal depending on the input signal as the output signal.

This exemplary embodiment not only evaluates the voltage level of the input signal furnished to the input terminal but also the current received from the current sink via the input terminal. If this current lies above a predetermined level, it will be assumed in this interface circuit that an input signal with high level should be furnished to the interface circuit, even if the level of this input signal drops on account of the current uptake of the current sink.

The current measurement arrangement of the interface circuit in one embodiment comprises a measuring resistance connected in series with the current sink, as well as a comparison arrangement, which is configured so that a voltage present across the measuring resistance is compared to a reference value and the current measurement signal will be dependent on this comparison.

The current sink of the interface circuit has, for example, a current source and a switch, connected in series with the current source and actuated by the transmission signal.

The logic circuit in one embodiment has an OR gate, to which the input signal and the current measurement signal are taken.

Figure 1:
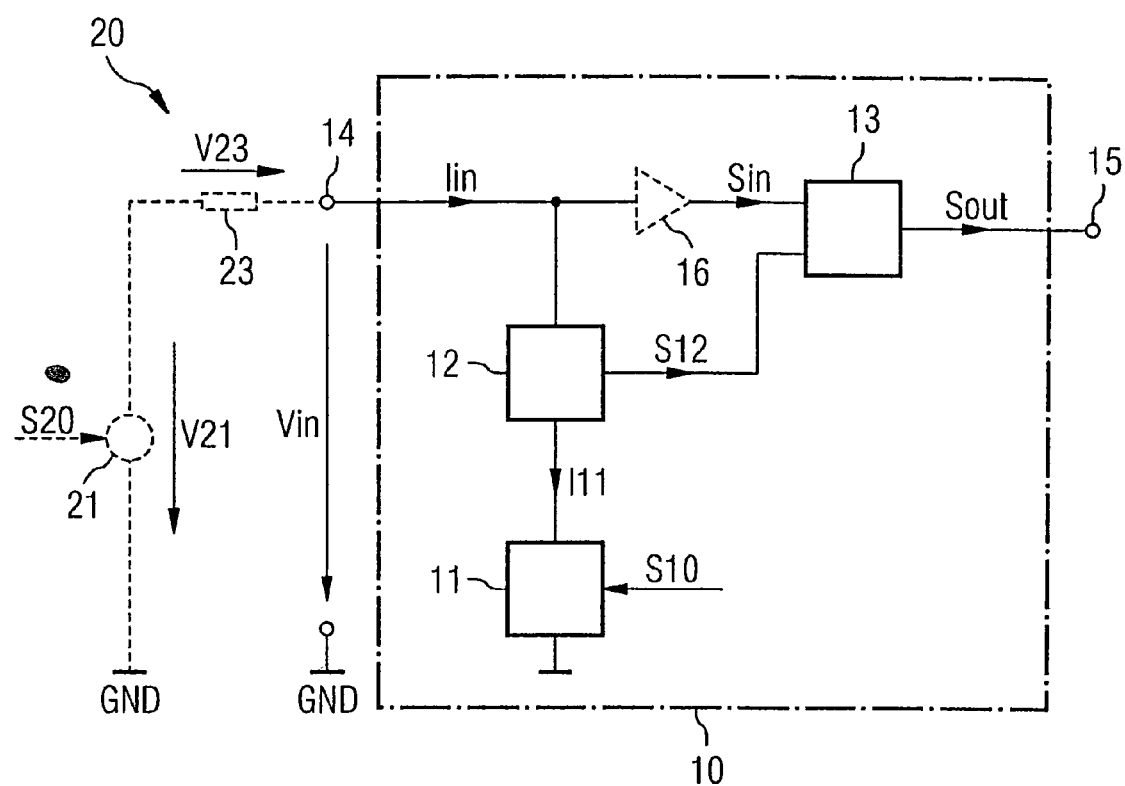
FIG. 1 is the block diagram of an exemplary embodiment of the interface circuit according to the invention, having a controllable current sink, and a current measurement arrangement.

FIG. 1 shows an exemplary embodiment of the interface circuit according to the invention. This interface circuit 10 has an input terminal 14 for furnishing an input signal Vin, as well as an output terminal 15 for furnishing an output signal Sout. For the explanation below, it is assumed that the input signal Vin furnished to the interface circuit 10 is a voltage signal, which is referred to a reference potential GND, for example, ground.

The interface circuit 10 moreover has a controllable current sink 11, which is coupled to the input terminal 14, and which is configured so that a current I11 is taken up from the input terminal 14 according to a transmission signal S10. A current measurement arrangement 12 detects the current I11 taken up by the current sink 11 and provides at an output a current measurement signal S12 that depends on the current taken up by the current sink 11. This current measurement signal S12 is, for example, a binary value signal, which takes on one of two possible signal levels according to whether the current I11 taken up by the current sink 11 lies above or below a threshold value.

The current measurement signal S12 furnished by the current measurement arrangement 12 and the input signal are taken to a logic circuit 13, which provides the output signal Sout depending on this current measurement signal S12 and depending on the input signal Vin.

Preferably, between the input 14 and the logic circuit 13 there is connected a logic buffer 16, e.g. a Schmitt trigger or a comparator, which converts the input voltage Vin into a logic signal Sin suitable for further processing by the logic circuit 13.

It will be appreciated, however, that the phrase input signal as used herein refers to either the signal as it appears at the terminal 14, or that signal as modified by a comparator, buffer, or Schmitt trigger.

Figure 2:
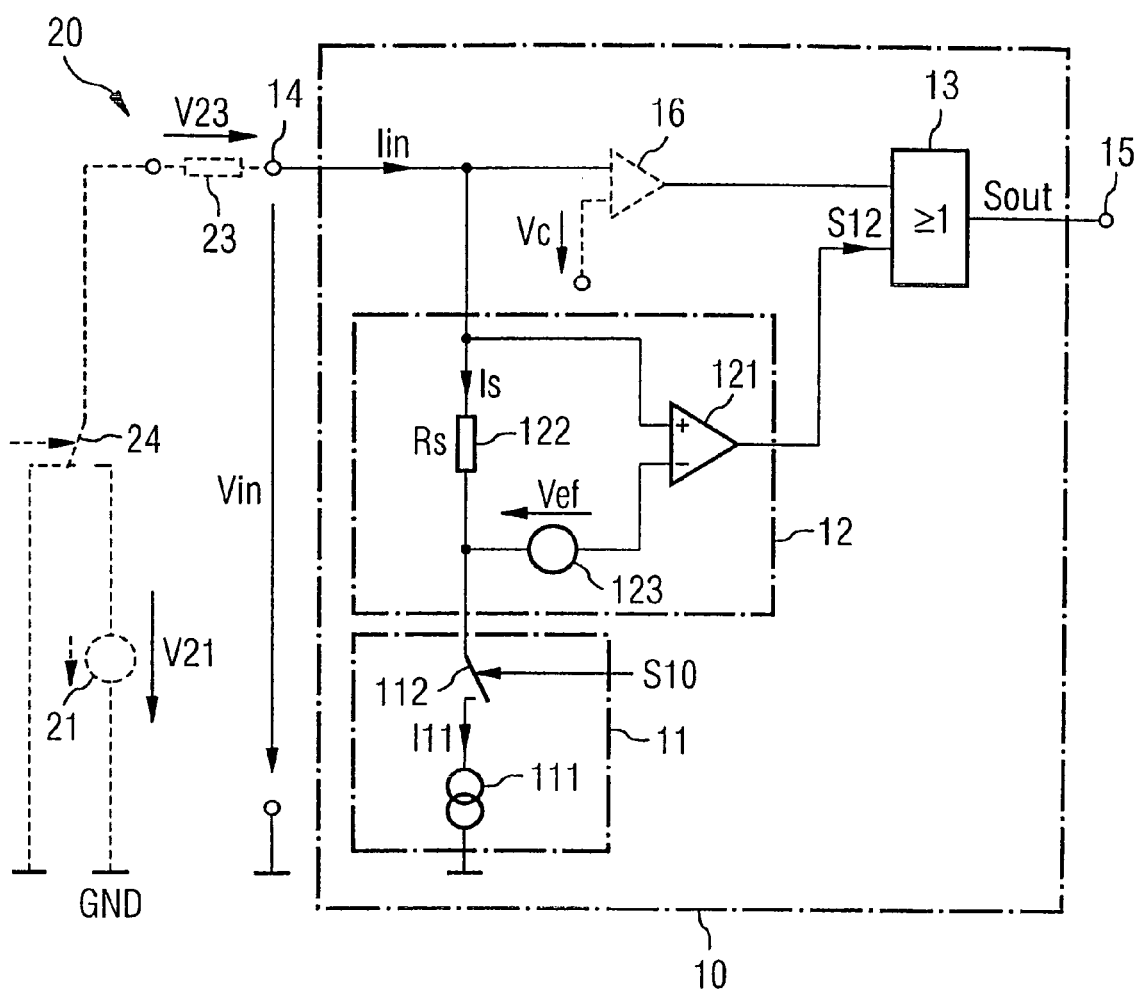
FIG. 2 shows the circuit layout of FIG. 1 with exemplary circuitry embodiments of the controllable current sink and the current measurement arrangement.

For a better understanding of the mode of operation of the interface circuit, FIG. 1 also shows a signal source 20 that is connected to the input terminal 14 of the interface circuit 10. This signal source 20 has a controllable voltage source 21. A resistance 23 is present between the voltage source and the input 14. This resistance 23 is necessary for detecting the status of the transmission signal S10 as will be explained below. Such resistance 23, which in FIG. 2 is represented by one resistor symbol, may result from an output resistance of the voltage source 21 and from an additional resistance connected in order to adjust the voltage drop across the resistance 23, and to therefore adjust the input voltage Vin of the interface circuit when the controllable current sink 11 is activated.

The interface circuit 10 is configured so as to evaluate the input voltage Vin present at the input terminal 14 and to generate a binary output signal Sout, which puts out a first or a second signal value of the output signal according to whether the input voltage lies above or below a predetermined signal threshold.

For purposes of the explanation, let it first be assumed that the voltage source 21 actuated by the signal S20 produces a voltage V21 not equal to zero. Furthermore, let it be assumed that the input current Iin is taken up by the interface circuit if the current sink 11 is not activated, and the resistance value of the output resistance 23 and the input current Iin are so attuned to each other that the input voltage Vin takes on a signal value that is recognized by the interface circuit 10 as being a value above the signal threshold (high level).

If the input current Iin increases when the current sink 11 is activated, i.e., when the current sink 11 is actuated so that it takes up a non negligible current I11 across the input terminal 14, the increased voltage drop V23 produced by the input current Iin at the output resistance 23 of the signal source 20 results in a drop in the input voltage Vin. This drop in the input voltage Vin can be detected by an evaluation circuit, not shown in greater detail in FIG. 1, which is likewise connected to the input 14 of the interface circuit 10. From the drop in this input voltage Vin, one can infer an increased current uptake of the interface circuit 10 and, thus, the signal value of the transmission signal S10. In this way, information from the interface circuit 10 can be transmitted to the outside across the input terminal 14. Thus, the input terminal 14 serves not only to receive an input signal Vin, but it is also able to modulate the input voltage Vin in terms of the current uptake I11 of the current sink 11, so as to transmit information to the outside; assuming that the input voltage is not equal to zero.

The information which is to be furnished to the interface circuit 10 is present in the signal level of the control signal S20, which controls the signal source 20 or the voltage source 21 of this signal source 20 and governs the input voltage Vin of the interface circuit 10. If the output resistance 23 of the signal source 20 is so large that the current I11 taken up by the current sink 11 at the output resistance 23 produces so great a voltage drop V23 that the input voltage Vin falls below the value of the signal threshold, the information contained in the control signal S20 will be lost, since a low level of the control signal S20 would be assumed for an input voltage Vin of approximately zero.

To avoid such errors, the interface circuit 10 has the current measurement arrangement 12, which evaluates the current taken up by the current sink 11 and furnishes the current measurement signal S12. If this current measurement signal S12 has a signal level which indicates a current uptake by the current sink 11 above a predetermined threshold value, one can assume that the outside transmission signal S20 has a high level, since only then can the voltage source 21 provide a sufficient current for the current sink 11. The logic circuit 13 is configured so that it can already generate an output level of the output signal Sout indicating a high level of the outside transmission signal S20 when the current measurement signal S12 is indicating a sufficiently high current uptake. Furthermore, the logic circuit 13 is also configured so as to generate a level of the output signal Sout indicating a high level of the outside transmission signal S20 when the input voltage Vin has a high level.

FIG. 2 shows the interface circuit according to FIG. 1, in which exemplary circuitry embodiments for the current sink 11 and the current measurement arrangement 12 are represented.

The current sink 11 in the example has a current source 111 and a switch 112, connected in series with the current source 111 and actuated by the internal transmission signal S10.

The current measurement arrangement 12 has a current measuring resistor 122, which is connected in series with the current sink 11. A comparator 121 compares a voltage V122, which is present across the current measuring resistor 122, to a reference voltage Vref and provides the current measurement signal S12 in accordance with this comparison. In the example shown, the current measurement signal S12 takes on a high level when the voltage present across the current measuring resistor V122 is greater than the reference voltage Vref, i.e., when:

$$Rs \cdot Is > V\text{ref} \tag{1}$$

Rs here denotes the resistance value of the current measuring resistor 122. Is denotes the current flowing through the current measurement arrangement 12, which coincides with the current taken up by the current sink 11. In this connection, it should be noted that the current sink 11, when the switch 112 is closed and when the voltage present across the current sink 11 is sufficiently large, takes up a current I11 dictated by the current source 111. This current, of course, can also be smaller than the nominal current dictated by the current source 111, namely when, owing to the voltage drop across the output resistance 23 of the signal source 20, the input voltage Vin drops so much that the current sink 11 can no longer provide the nominal current.

The task of the current measurement arrangement 12 is to determine whether a current is being taken up by the current sink 11, it being assumed that a current uptake of the current sink 11 is only possible when a voltage V21 not equal to zero is made available by the signal source 20. The value Rs of the current measuring resistor 122 and the reference voltage Vref produced by a reference voltage source 123 are preferably attuned to each other so that $$V\text{ref} \ll Rs \cdot I11 \tag{2}$$

I11 denotes here the nominal current of the current sink 11. As long as condition (2) is fulfilled, a high level for the current measurement signal S12 will be provided whenever the current uptake of the current sink 11 is still below the nominal current, which is the case, for example, when the output resistance 23 of the signal source 20 is very large, so that the voltage V21 provided internally by the signal source 20 drops off totally across the output resistance 23 even when the currents taken up by the signal sink 11 are low.

The logic circuit 13 is configured, for example, as an OR gate, which produces a high level for the output signal Sout when even one of the two signals, namely, the input signal Vin or the current measurement signal S12, takes on a high level.

The interface circuit according to the invention will be explained hereinbelow by means of time curves of the signals occurring in the interface circuit.

FIG. 3 illustrates the time curves of the outside transmission signal S20, the internal transmission signal S10, the voltage V21 furnished internally by the signal source 20, the resulting input voltage Vin of the interface circuit 10, of the current measurement signal S12 and of the output signal Sout of the interface circuit. The time curves are shown in FIG. 3 for different levels of the internal transmission signal S10 and for different output resistances of the signal source 20 connected to the output 14.

FIG. 3 shows, at the left, the time curves of the represented signals for the case when the outside transmission signal S20 adopts a high level and the internal transmission signal S10, a low level. For the following discussion, it is assumed that the signal source 20 produces internally a voltage V21 not equal to zero when the outside transmission signal S20 has a high level and that the current sink 11 of the interface circuit 10 takes up no current, or only a negligibly small current from the input terminal 14, when the internal transmission signal S10 has a low level. Furthermore, it is assumed that the input current Iin of the interface circuit 10 is approximately zero when the internal transmission signal S10 is at low level, so that the input voltage Vin of the interface circuit 10 corresponds to the voltage V21 provided internally by the signal source 20.

It should be pointed out that this voltage V21, and thus the input voltage Vin, should naturally be chosen such that the input voltage Vin takes on a sufficiently high signal value when the outside transmission signal has a high level S20, which is also recognized by the logic circuit 13 of the interface circuit 10 as being a high level. From this high level of the input voltage Vin, the interface circuit 13 generates a high level for the output signal Sout.

To process the input voltage Vin, it is possible to connect a comparator 16 in front of the logic circuit 13, comparing the input voltage Vin to a comparison value Vc and generating a signal Sin depending on the comparison of the input voltage Vin to this comparison value Vc. The output signal Sin of this comparator 16 is thus attuned to the logic level which can be processed by the logic circuit 13. However, any buffer component may be used instead of the comparator which is suitable for adjusting or amplifying the level of the input voltage Vin to a signal level which can be processed by the logic circuit.

FIG. 3 shows, in the center part, an operating situation of the interface circuit 10 in which the outside transmission signal S20 takes on a high level and in which the internal transmission signal S10 switches at time t1 from a low level to a high level, so as to bring about a current uptake by the current sink 11 and thereby modulate the input voltage Vin. The current taken up by the current sink 11 as of time t1 across the input terminal 14 leads to a voltage drop V23 across the output resistance 23 of the signal source, which reduces the input voltage Vin by the value of this voltage drop V23. Let us assume that the input voltage Vin as a result of the voltage drop V23 at the output resistance 23 does not fall below a value that is still recognized by the logic circuit 13 or by the comparator circuit connected in front of the logic circuit 13 as being a high level of the input voltage Vin. In this case, in order to detect the level of the outside transmission signal S20, it would already suffice to evaluate the input voltage Vin. The current measurement signal S12, which takes on a high level as soon as the current sink 11 takes up current across the input terminal 14, merely increases in this case the certainty of detection of the input signal.

FIG. 3 shows, at the right, an operating situation for the interface circuit 10 in which the output resistance 23 of the signal source is so high that, after a time t2, when the internal transmission signal S10 has taken on a high level, the input voltage Vin has dropped to a very low value, which is no longer recognized by the logic circuit 13 or the comparator circuit 16 connected in front of the logic circuit 13 as being a high level of the input signal. A correct detection of the outside transmission signal S20 in this operating situation is only ensured by the current measurement signal S12, which takes on a high level at the start of the current uptake by the current sink 11.

The interface circuit according to the invention 10 ensures that the operating case in which the input voltage Vin takes on the value of zero because the outside transmission signal S20 takes on the value of zero can be distinguished from the operating case in which the input voltage Vin due to the current uptake of the current sink 11 takes on the value of zero, or a very low value which can be interpreted as zero by the logic circuit 13.

Finally, it should be pointed out that a signal transmission from the interface circuit 10 to the outside is possible only when the signal supplied from the outside takes on a high level.

The invention claimed is:

1. Interface circuit, comprising:
   an input terminal configured to provide an input signal and receive information present in the input signal,
   a controlled current sink operably coupled to the input terminal, the controlled current sink operable to controllably take up a current from the input terminal according to a transmission signal for providing information via the input terminal,
   a current measurement arrangement configured to generate a current measurement signal based on the current taken up by the current sink,
   a logic circuit operably coupled to receive the current measurement signal and the input signal, the logic circuit configured to generate a signal depending on the input signal.

2. The interface circuit according to claim 1, wherein the current measurement arrangement comprises
   a measuring resistor connected in series with the current sink,
   a comparison arrangement configured to generate the current measurement signal based on a comparison of a voltage present across the measuring resistor and a reference value.

3. The interface circuit according to claim 1, wherein the current sink comprises a current source and a switch connected in series with the current source, the switch controllably actuated responsive to the transmission signal.

4. The interface circuit according to claim 1, wherein the logic circuit comprises an OR gate, the OR gate operable to perform an OR operation on with the input signal and the current measurement signal.

5. The interface circuit according to claim 1, wherein the input terminal includes further comprises a buffer configured to generate the input signal from an external input signal.

6. An interface circuit, comprising:
a controlled current sink operably coupled to receive a first input signal, the controlled current sink operable to controllably take up a current from the first input signal according to a transmission signal for providing information via an input terminal,
a current measurement arrangement configured to generate a current measurement signal based on the current taken up by the current sink,
a logic circuit operably coupled to receive the current measurement signal and a second input signal, the second input signal representative of the first input signal, the logic circuit configured to generate an output signal depending on the second input signal and the current measurement signal.

7. The interface circuit according to claim 6, wherein the current measurement arrangement comprises
a measuring resistor connected in series with the current sink,
a comparison arrangement configured to generate the current measurement signal based on a comparison of a voltage present across the measuring resistor and a reference value.

8. The interface circuit according to claim 6, wherein the current sink comprises a current source and a switch connected in series with the current source, the switch controllably actuated responsive to the transmission signal.

9. The interface circuit according to claim 6, wherein the logic circuit comprises an OR gate, the OR gate operable to perform an OR operation on with the second input signal and the current measurement signal.

10. The interface circuit according to claim 6, wherein the input terminal includes further comprises a buffer configured to generate the second input signal based on the first input signal.

11. The interface circuit according to claim 6, wherein the current measurement arrangement comprises
a measuring resistor connected in series with the current sink,
an arrangement configured to provide the current measurement signal based on a voltage present across the measuring resistor.

12. The interface circuit according to claim 11, wherein the arrangement comprises a comparator.

13. The interface circuit according to claim 11, wherein the current sink comprises a current source and a switch connected in series with the current source, the switch controllably actuated responsive to the transmission signal.

14. The interface circuit according to claim 11, wherein the logic circuit comprises an OR gate, the OR gate operable to perform an OR operation on with the second input signal and the current measurement signal.

15. The interface circuit according to claim 11, wherein the input terminal includes further comprises a buffer configured to generate the second input signal based on the first input signal.

16. The interface circuit according to claim 12, wherein the current sink comprises a current source and a switch connected in series with the current source, the switch controllably actuated responsive to the transmission signal.

17. The interface circuit according to claim 16, wherein the logic circuit comprises an OR gate, the OR gate operable to perform an OR operation on with the second input signal and the current measurement signal.

18. The interface circuit according to claim 17, wherein the input terminal includes further comprises a buffer configured to generate the second input signal based on the first input signal.

* * * * *